(12) United States Patent
Gerstmeier et al.

(10) Patent No.: US 7,279,881 B2
(45) Date of Patent: Oct. 9, 2007

(54) INTEGRATED CIRCUIT FOR REGULATING A VOLTAGE GENERATOR

(75) Inventors: Günter Gerstmeier, Tandern (DE); Michael Bernhard Sommer, Raubling (DE)

(73) Assignee: Infineon, AG, Neubiberg (DE)

( * ) Notice: Subject to any disclaimer, the term of this patent is extended or adjusted under 35 U.S.C. 154(b) by 220 days.

(21) Appl. No.: 11/218,740

(22) Filed: Sep. 6, 2005

(65) Prior Publication Data

US 2006/0049817 A1    Mar. 9, 2006

(30) Foreign Application Priority Data

Sep. 6, 2004    (DE) .................... 10 2004 043 034

(51) Int. Cl.
*G05F 3/24* (2006.01)
(52) U.S. Cl. .................................... 323/313
(58) Field of Classification Search ............... 323/311, 323/312, 313, 314, 315, 316, 317
See application file for complete search history.

(56) References Cited

U.S. PATENT DOCUMENTS

| | | | | |
|---|---|---|---|---|
| 4,704,561 A | * | 11/1987 | Dietl ........................ 315/219 |
| 5,315,166 A | * | 5/1994 | Arimoto ..................... 327/537 |
| 6,339,318 B1 | | 1/2002 | Tanaka | |
| 6,570,367 B2 | * | 5/2003 | Bartenschlager et al. ... 323/269 |
| 6,894,928 B2 | * | 5/2005 | Owen .................... 365/185.14 |

FOREIGN PATENT DOCUMENTS

| EP | 0321226 A1 | 12/1988 |
|---|---|---|
| JP | 05152925 A2 | 6/1993 |
| JP | 08221142 A2 | 8/1996 |

\* cited by examiner

*Primary Examiner*—Adolf Berhane
(74) *Attorney, Agent, or Firm*—Edell, Shapiro & Finnan, LLC

(57) ABSTRACT

An integrated circuit includes a voltage generator with a first controllable resistor and a second controllable resistor, through which a first input terminal that applies a first voltage potential and a second input terminal that applies a second voltage potential can be connected to an output terminal that generates an output voltage. In a manner dependent on the output voltage, a first comparator circuit generates a first control signal to control the first controllable resistor, and a second comparator circuit generates a second control signal to control the second controllable resistor. A control unit evaluates the control signals generated by the comparator circuits and drives the first and second controllable resistors of the voltage generator in such a way that in each case only one of the two controllable resistors has a low-resistance state.

19 Claims, 7 Drawing Sheets

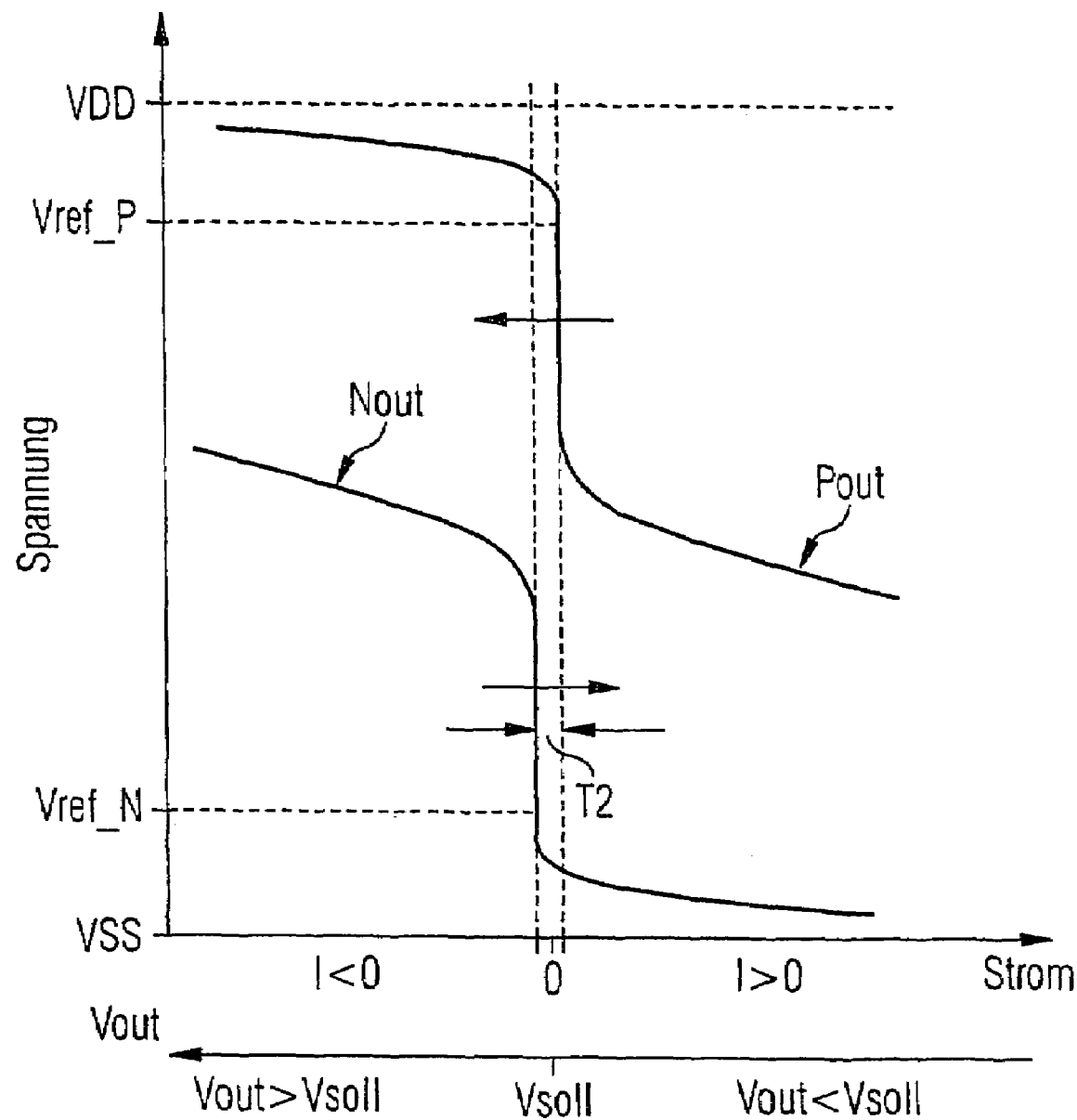

INTEGRATED CIRCUIT FOR REGULATING A VOLTAGE GENERATOR

CROSS REFERENCE TO RELATED APPLICATIONS

This application claims priority under 35 USC §119 to German Application No. 10 2004 043 034.9, filed on Sep. 6, 2004, and titled "Integrated Circuit For Regulating A Voltage Generator," the entire contents of which are hereby incorporated by reference.

FIELD OF THE INVENTION

The present invention relates to an integrated circuit for regulating a voltage generator such as a push-pull generator.

BACKGROUND

Many semiconductor components, for example DRAM (Dynamic Random Access Memory) semiconductor memories require, for their operation, internally regulated voltages that are derived from an external supply voltage. The internal voltages are fed into an internal voltage network of the semiconductor component. Voltage regulating circuits are used to compensate for voltage fluctuations in the internal voltage network.

FIG. 7 shows a so-called push-pull generator 30 for generating an output voltage Vout that is fed into an internal voltage network of an integrated circuit. The push-pull generator 30 has a first controllable resistor 31 and a second controllable resistor 32. The two controllable resistors are embodied as transistors in the exemplary embodiment of FIG. 7. The transistor 31 is embodied as a p-channel transistor and connects an input terminal E30a for applying a supply voltage VDD to an output terminal A30 for generating the output voltage Vout. The transistor 32 is embodied as an n-channel transistor and connects an input terminal E30b for applying a reference voltage VSS to the output terminal A30 for generating the output voltage Vout. The resistances of the controllable paths of the transistors 31 and 32 can be controlled by control signals Pout and Nout at their control terminals S31 and S32.

For generating the control signal Pout, the control terminal S31 of the transistor 31 is driven by a comparator circuit 10. The comparator circuit 10 is embodied as a differential amplifier connected between a terminal V10a for application of a supply voltage VDD and a terminal V10b for application of a reference voltage VSS. The differential amplifier 10 has an input transistor 11 with an input terminal E10a for application of a reference voltage Vref_P and an input transistor 12 with an input terminal E20a, from which the output voltage Vout of an internal voltage network of the integrated circuit is fed back into the comparator circuit 10. The input transistors of the differential amplifier 10 are embodied as n-channel transistors. The two input transistors 11 and 12 are connected via an active load 13, which comprises the two p-channel transistors 13a and 13b connected as a current mirror, to the supply terminal V10b for application of the reference voltage VSS. A controlled current source 14 is connected into a common branch of the two input transistors 11 and 12 that connects the input transistors to the terminal V10a for application of the supply voltage VDD. In the exemplary embodiment of FIG. 7, the controlled current source is designed as an n-channel transistor, it being possible to set the current in the common branch by applying an operating point signal BS1 to a control terminal S14.

The control terminal S32 of the n-channel transistor 32 is driven with the control signal Nout by a second comparator circuit 20. The comparator circuit 20 is designed as a complementary differential amplifier in comparison with the differential amplifier 10. The differential amplifier 20 has a first input transistor 21, which is driven by a reference voltage Vref_N at an input terminal E20a, and a second input transistor 22 with an input terminal E20b, to which the output voltage Vout of the internal voltage network is fed back. The differential amplifier circuit 20 is connected between a terminal V20a for application of the supply voltage VDD and a terminal V20b for application of the reference voltage VSS. The p-channel input transistors 21 and 22 are connected via an active load 23, which has the two n-channel transistors 23a and 23b connected as a current mirror, to the terminal V20b for application of the reference voltage VSS. A common branch of the input transistors 21 and 22 is connected via a controlled current source 24 to the terminal V20a for application of the supply voltage VDD. The controlled current source is embodied as a p-channel transistor. The current supplied by it can be set by means of an operating point signal BS2 at a control terminal S24 of the p-channel transistor 24.

FIG. 8 illustrates the functioning of the regulable push-pull generator of FIG. 7. The illustration shows the voltage levels of the first and second control signals Pout and Nout generated by the comparator circuits 10 and 20 against a current I fed into the internal voltage network, and also against the output voltage Vout of the internal voltage network the voltage Vout of the internal voltage network is intended to be held at a constant voltage level Vdesired by the circuit arrangement illustrated in FIG. 7. In the case of an overvoltage, if the voltage Vout of the internal voltage network is greater than the desired voltage Vdesired, the p-channel transistor 31 is driven by a high level in the vicinity of the supply voltage VDD. The controllable path of the p-channel transistor 31 is thereby controlled in high-resistance fashion (or a high-resistance state). At the same time the control terminal S32 of the n-channel transistor 32 is driven by a level of the control signal Nout that lies between the supply voltage VDD and the reference voltage VSS, for example a ground potential. The controllable path of the n-channel transistor 32 is thereby controlled in low-resistance fashion (or a low-resistance state), so that the output terminal A30 of the voltage generator circuit 30 connected to the internal voltage network is connected to the reference voltage VSS in low-resistance fashion. A current I<0 thus flows, which current flows away from the internal voltage network to the input terminal E30b for application of the reference voltage VSS.

If the voltage Vout of the internal network is less than the desired voltage Vdesired, that is to say a case of undervoltage is present, the n-channel transistor 31 is driven, by the comparator circuit 10, with a level of the control signal Pout that controls the controllable path of the p-channel transistor 31 in low-resistance fashion. The internal voltage network is thus connected to the supply voltage VDD in low-resistance fashion via the output terminal A30 of the voltage generator circuit 30 and the p-channel transistor 31. The comparator circuit 20 drives the control terminal S32 of the n-channel transistor 32 with a low level of the control signal Nout that is close to the reference voltage VSS. The controllable path of the n-channel transistor 32 is thus controlled in high-resistance fashion.

The controllable paths of the transistors 31 and 32 are controlled in high-resistance fashion in a small range T2 around the level of the desired voltage Vdesired. This is intended to prevent a high shunt current from flowing from the input terminal E30a of the voltage generator circuit 30 for application of the supply voltage VDD to the input terminal E30b for application of the reference voltage VSS via the transistors 31 and 32. However, a shift in the operating points of the two complementary differential amplifiers may occur on account of external influences, e.g. as a result of process or temperature fluctuations. As a result, the curve of the control signal Pout illustrated in FIG. 8 is shifted toward the left and the curve of the control signal Nout is shifted toward the right. The so-called dead zone T2, in which both transistors are controlled in high-resistance fashion, gradually disappears. As a result, both transistors 31 and 32 are controlled in low-resistance fashion in a range around the desired voltage Vdesired. The consequence is a large shunt current between the input terminal E30a and the input terminal E30b of the voltage generator circuit. The current consumption of the voltage generator circuit thus rises considerably.

A simple measure for preventing the shunt current consists in enlarging the dead zone. However, this leads to an increased tolerance with respect to deviations from the desired voltage level Vdesired of the internal voltage network, since the two transistors 31 and 32 of the push-pull generator 30 are only regulated in the event of a larger deviation from the desired value Vdesired.

SUMMARY

An object of the present invention is to provide an integrated circuit that reduces the current consumption of a voltage generator for generating a regulated output voltage.

Another object of the present invention is to specify a method that reduces the current consumption of a voltage generator for generating a regulated output voltage.

The aforesaid objects are achieved individually and/or in combination, and it is not intended that the present invention be construed as requiring two or more of the objects to be combined unless expressly required by the claims attached hereto.

In accordance with the present invention, an integrated circuit is provided for regulating a voltage generator, including a first input terminal to apply a first voltage potential and a second input terminal to apply a second voltage potential, and also an output terminal to generate an output voltage. The integrated circuit comprises a voltage generator with a first controllable resistor and a second controllable resistor, which each comprise a control terminal to set their respective resistance values. The first input terminal is connected via the first controllable resistor and the second input terminal is connected via the second controllable resistor to the output terminal. The integrated circuit furthermore comprises a first comparator circuit to generate a level of a first control signal in a manner dependent on a comparison of the output voltage with a first reference voltage. The first control signal can be fed to the control terminal of the first controllable resistor to set its resistance value. The integrated circuit according to the invention furthermore comprises a second comparator circuit to generate a level of a second control signal in a manner dependent on a comparison of the output voltage with a second reference voltage. The second control signal can be fed to the control terminal of the second controllable resistor to set its resistance value.

Furthermore, the integrated circuit includes a control unit to generate a first level of the first control signal and to generate a second level of the second control signal. For this purpose, the control unit is driven with the first control signal by the first comparator circuit and with the second control signal by the second comparator circuit. The first level of the first control signal that is generated by the control unit can be fed to the control terminal of the first controllable resistor to set its resistance value. The second level of the second control signal that is generated by the control circuit can be fed to the control terminal of the second controllable resistor to set its resistance value. The control unit is designed, according to the invention, in such a way that it drives the control terminal of the first controllable resistor with the level of the first control signal that is generated by the first comparator circuit if the control unit is driven, by the first comparator circuit, with a level of the first control signal that controls the first controllable resistor in low-resistance fashion, and is driven, by the second comparator circuit, with a level of the second control signal that controls the second controllable resistor in high-resistance fashion, and in all other cases the control unit drives the first controllable resistor with the first level of the first control signal, so that the first controllable resistor is controlled in high-resistance fashion.

Furthermore, the control unit is designed in such a way that it drives the control terminal of the second controllable resistor with the level of the second control signal that is generated by the second comparator circuit if the control unit is driven, by the first comparator circuit, with a level of the first control signal that controls the first controllable resistor in high-resistance fashion, and the control unit is driven, by the second comparator circuit, with a level of the second control signal that controls the second controllable resistor in low-resistance fashion, and in all other cases the control unit drives the second controllable resistor with the second level of the second control signal, so that the second controllable resistor is controlled in high-resistance fashion.

The first and second comparator circuits are preferably designed as differential amplifiers. The differential amplifier of the first comparator circuit exhibits complementary behavior with respect to the differential amplifier of the second comparator circuit.

In the event of direct driving of the controllable resistors by the differential amplifiers the situation often occurs that one of the differential amplifiers controls one of the controllable resistors in low-resistance fashion and the other of the two differential amplifiers controls the other of the two controllable resistors in high-resistance fashion. As a result, a shunt current flows through both controllable resistors. The integrated circuit according to the invention makes it possible for in each case one of the controllable resistors of the voltage generator to be turned off and the other of the two controllable resistors to be controlled in low-resistance fashion. The driving of the controllable resistors by the control unit thus completely prevents the occurrence of a shunt current between the first input terminal for applying the first voltage potential and the second input terminal for applying the second voltage potential.

In one development of the integrated circuit according to the invention, the first controllable resistor is designed as a transistor having a threshold voltage, which is controlled in low-resistance fashion if its control terminal is driven by a level of a control signal that lies in a first voltage range. Furthermore, the second controllable resistor is likewise designed as a transistor having a threshold voltage, which is controlled in low-resistance fashion if its control terminal is driven by a level of a control signal that lies in a second voltage range. In this embodiment, the control unit is designed in such a way that it generates the first control signal with the first level if the first comparator circuit drives the control unit with a level of the first control signal that lies in the first voltage range, and at the same time the second comparator circuit drives the control unit with a level of the second control signal that lies in the second voltage range. Furthermore, the control unit is designed in such a way that it generates the second control signal with the second level if the first comparator circuit drives the control unit with a level of the first control signal that lies in the first voltage range, and at the same time the second comparator circuit drives the control unit with a level of the second control signal that lies in the second voltage range.

If the first transistor were driven exclusively by the first comparator circuit and the second transistor were driven exclusively by the second comparator circuit, it can happen that both comparator circuits drive the two transistors in such a way that both transistors would be controlled in low-resistance fashion. This is the case for example when a shift in the operating points of the two comparator circuits designed as differential amplifiers occurs on account of external influences, for example on account of process fluctuations. If the control unit according to the invention is driven, on the input side, by the first comparator circuit with a level of the first control signal that would control the first transistor in low-resistance fashion in the case of direct driving of the control terminal of the first transistor, and if it is simultaneously driven by the second comparator circuit with a level of the second control signal that would control the second transistor, too, in low-resistance fashion in the case of direct driving of the control terminal of the second transistor, then the control unit generates, on the output side, the first control signal with the first level, which reliably turns off the first transistor, and at the same time the second control signal with the second level, which reliably turns off the second transistor, too. As a result, both transistors are momentarily turned off. A high shunt current between the first input terminal and the second input terminal, such as occurs in the case of direct driving of the control terminals of the first and second transistors by the comparator circuits in accordance with the previous prior art, is thus prevented according to the invention.

In another embodiment of the integrated circuit according to the invention, the control unit comprises a first control circuit and a second control circuit. The first and second control circuits are respectively fed the first control signal from the first comparator circuit and the second control signal from the second comparator circuit. Furthermore, the first voltage potential and the second voltage potential are respectively fed to the first and second control circuits on the input side. The first control circuit is designed in such a way that it drives the control terminal of the first controllable resistor of the voltage generator circuit with the first voltage potential if the first control circuit is driven by the level of the first control signal that lies at the predetermined distance from the first voltage potential. The second control circuit is designed in such a way that it drives the control terminal of the second controllable resistor of the voltage generator circuit with the second voltage potential if the second control circuit is driven by the level of the second control signal that lies at the predetermined distance from the second voltage potential.

In another embodiment of the integrated circuit according to the invention, the first control circuit comprises a controllable switch, via which the first voltage potential can be fed to the control terminal of the first controllable resistor of the voltage generator circuit. The first control circuit comprises a differential amplifier, which, on the output side, is connected to a control terminal of the first controllable switch of the first control circuit. The differential amplifier is designed in such a way that it controls the first controllable switch into the on state if the differential amplifier is driven, by the first comparator circuit, with a level of the first control signal that lies at the predetermined distance from the first voltage potential.

In accordance with a further embodiment of the integrated circuit according to the invention, the second control circuit comprises a controllable switch from which the second voltage potential can be fed to the control terminal of the second controllable resistor of the voltage generator circuit. Furthermore, the second control circuit comprises a differential amplifier, which, on the output side, is connected to a control terminal of the first controllable switch of the second control circuit. The differential amplifier is designed in such a way that it controls the first controllable switch into the on state if the differential amplifier is driven, by the second comparator circuit, with a level of the second control signal that lies at the predetermined distance from the second voltage potential.

Since one of the two differential amplifiers always controls into the on state the first controllable switch that is assigned to it, either the first control circuit generates the first voltage potential at the control terminal of the first controllable resistor or the second control circuit generates the second voltage potential at the control terminal of the second controllable resistor. This ensures that one of the two controllable resistors of the voltage generator circuit is always reliably turned off.

In accordance with a further type of embodiment of the integrated circuit, the first control circuit comprises a second controllable switch, from which the differential amplifier of the first control circuit can be connected to the first voltage potential. The second controllable switch of the first control circuit is controlled by the first control signal. In this case, the second controllable switch of the first control circuit is designed in such a way that it is turned off if the second control circuit generates the second control signal with the second level on the output side, and it is otherwise controlled into the on state.

In accordance with a further feature of the integrated circuit, the second control circuit comprises a second controllable switch, from which the differential amplifier of the second control circuit can be connected to the first voltage potential. The second controllable switch of the second control circuit is controlled by the first control signal. In this case, the second controllable switch of the second control circuit is designed in such a way that it is turned off if the first control circuit generates the first control signal with the first level on the output side, and it is otherwise controlled into the on state.

The first control circuit thus isolates the differential amplifier of the second control circuit from the first voltage potential, for example a supply voltage, if the first control circuit generates the first control signal with the first level on the output side. In this instance, the first controllable resistor is turned off and the second controllable resistor is regulated by the second comparator circuit. Conversely, the second control circuit isolates the differential amplifier of the first control circuit from the input terminal for application of the first voltage potential in that it turns off the second controllable switch of the first control circuit if the second control circuit generates the second control signal with the second level on the output side. In this instance, the second controllable resistor is turned off, whereas the first controllable resistor is controlled in low-resistance fashion by the first comparator circuit.

A method for operating an integrated circuit in accordance with the invention provides for the provision of a first transistor of a first conductivity type, which can be controlled by a first control signal and from which a terminal for applying a supply voltage can be connected to an output terminal for generating an output voltage. Furthermore, a second transistor of a second conductivity type is provided, which can be controlled by a second control signal and via which a terminal for applying a reference voltage can be connected to the output terminal for generating the output voltage. Furthermore, a control unit is provided to drive the first controllable resistor with the first control signal and to drive the second controllable resistor with the second control signal. A first comparator circuit is further provided to compare an actual value of the output voltage with a first reference voltage, and a second comparator circuit is provided to compare the actual value of the output voltage with a second reference voltage. The first comparator circuit generates an output signal in a manner dependent on the comparison of the actual value of the output voltage with the first reference voltage. The second comparator circuit generates an output signal in a manner dependent on the comparison of the actual value of the output voltage with the second reference voltage. The control unit is driven with the output signal of the first comparator circuit and with the output signal of the second comparator circuit. The control terminal of the first controllable resistor is driven by the control unit with the output signal generated by the first comparator circuit if the control unit is driven with a level of the output signal of the first comparator circuit that controls the first controllable resistor in low-resistance fashion, and if the control unit is driven with a level of the output signal of the second comparator circuit that controls the second controllable resistor in high-resistance fashion. In all other cases, the first controllable resistor is driven with a first level of the first control signal, where the first controllable resistor is controlled in high-resistance fashion. The control terminal of the second controllable resistor is driven by the control unit with the output signal generated by the second comparator circuit if the control unit is driven with a level of the output signal of the first comparator circuit that controls the first controllable resistor in high-resistance fashion, and if the control unit is driven with a level of the output signal of the second comparator circuit that controls the second controllable resistor in low-resistance fashion. In all other cases, the second controllable resistor is driven with a second level of the second control signal, where the second controllable resistor is controlled in high-resistance fashion.

The above and still further objects, features and advantages of the present invention will become apparent upon consideration of the following detailed description of specific embodiments thereof, particularly when taken in conjunction with the accompanying drawings.

BRIEF DESCRIPTION OF THE FIGURES

FIG. 8 depicts a current/voltage diagram with control signals for regulating a voltage generator according to the prior art.

DETAILED DESCRIPTION

Figure 1:
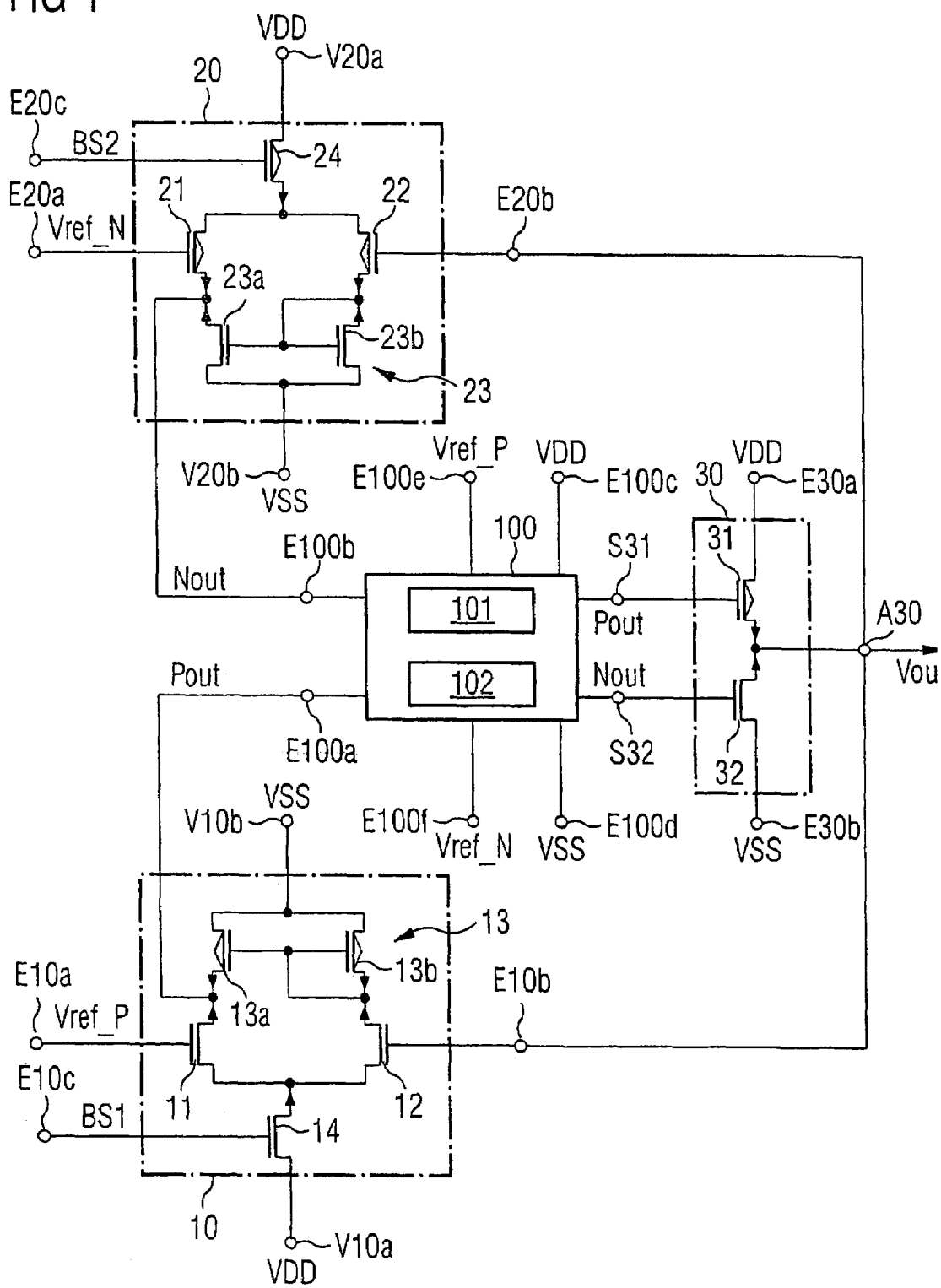
FIG. 1 depicts a first embodiment of an integrated circuit for regulating a voltage generator according to the invention.

FIG. 1 shows a first embodiment of an integrated circuit for regulating a voltage generator 30, which is embodied as a push-pull generator. In this case, the construction of the push-pull generator corresponds to the construction of the voltage generator 30 already described in FIG. 7. Furthermore, the integrated circuit of FIG. 1 includes comparator circuits 10 and 20 for generating the control signals Pout and Nout, with which the control terminals S31 of the p-channel transistor 31 and S32 of the n-channel transistor 32 are driven, which comparator circuits have already been described in FIG. 7.

Figure 7:
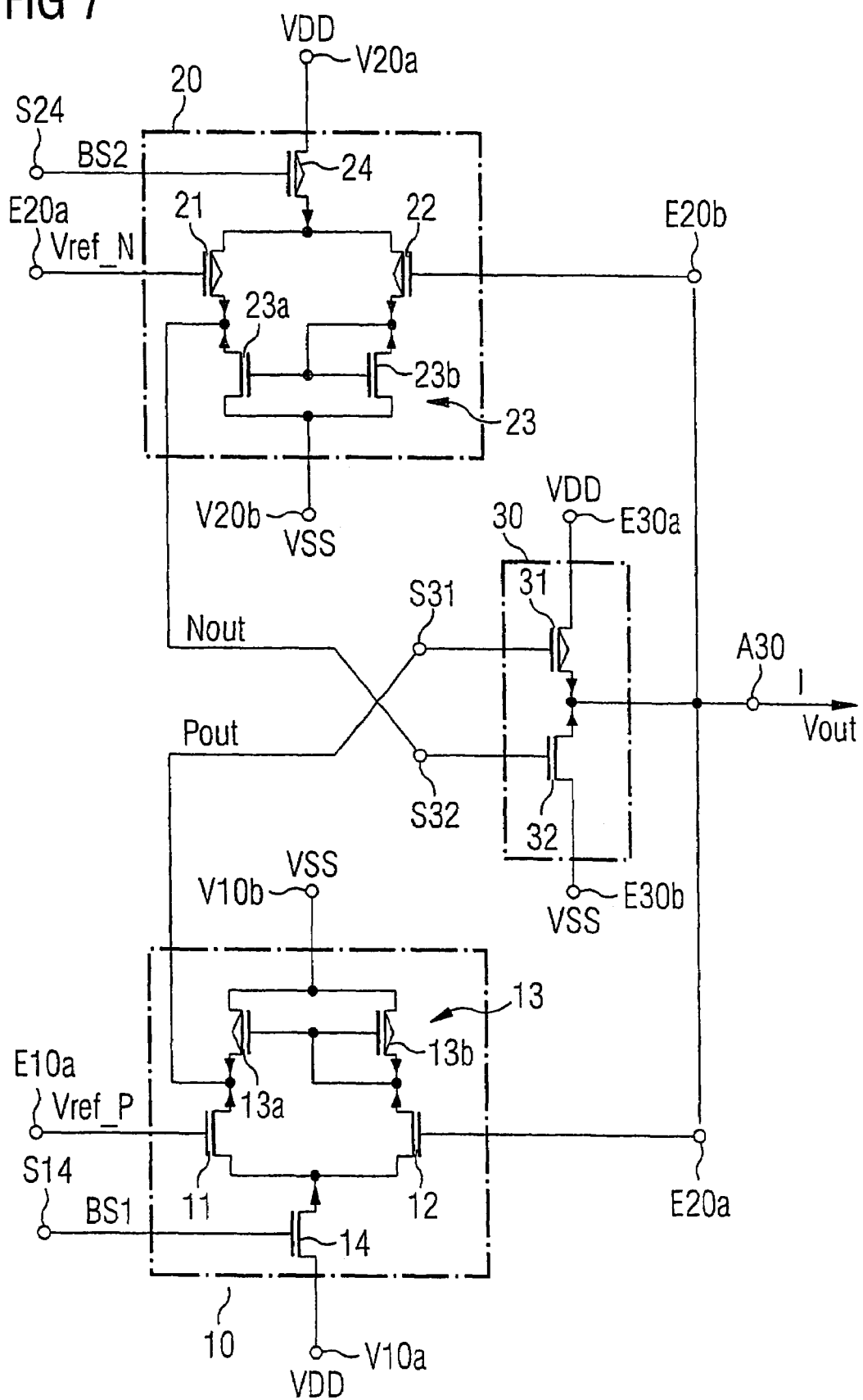
FIG. 7 depicts an embodiment of an integrated circuit for regulating a voltage generator according to the prior art.

In contrast to the embodiment of FIG. 7, the control signals generated by the differential amplifier circuits 10 and 20 as shown in FIG. 1 are fed to input terminals E100a and E100b of a control unit 100. The control unit 100 further includes input terminals E100c for application of the supply voltage VDD, E100d for application of the reference voltage VSS, E100e for application of the reference voltage Vref_P and E100f for application of the reference voltage Vref_N.

The control unit 100 further includes a first control circuit 101 and a second control circuit 102. The first control circuit 101 serves for generating the control signal Pout, which drives the control terminal S31 of the p-channel transistor 31. The control circuit 102 serves for generating the control signal Nout, which drives the control terminal S32 of the n-channel transistor 32.

First control unit 101 is designed in such a way that it drives the first controllable resistor 31 with a level of the control signal Pout that is fed to it from the comparator circuit 10 if the comparator circuit 10 generates on the output side a level of the control signal Pout that controls the p-channel transistor 31 in low-resistance fashion, and if at the same time the comparator circuit 20 generates on the output side the control signal Nout with a level that controls the n-channel transistor 32 in high-resistance fashion. In all other cases, it generates the control signal Pout with a high level on the output side, so that the controllable resistor 31 is controlled in high-resistance fashion.

Control circuit 102 generates, on the output side, the control signal Nout with the same level Nout that is fed to it from the comparator circuit 20 if the comparator circuit 20 generates on the output side the control signal Nout with a level that controls the controllable resistor 32 in low-resistance fashion, and if at the same time the comparator circuit 10 generates on the output side the control signal Pout with a level that controls the controllable resistor 31 in high-resistance fashion. In all other cases, it generates the control signal Nout with a low level, so that the n-channel transistor 32 is controlled in high-resistance fashion.

Consequently, the control circuit 100 always drives the transistors 31 and 32 in such a way that there are never both transistors in a low-resistance state. A shunt current between the input terminal E30a for application of the supply voltage and the input terminal E30b for application of the reference voltage is thus avoided.

Figure 2A:
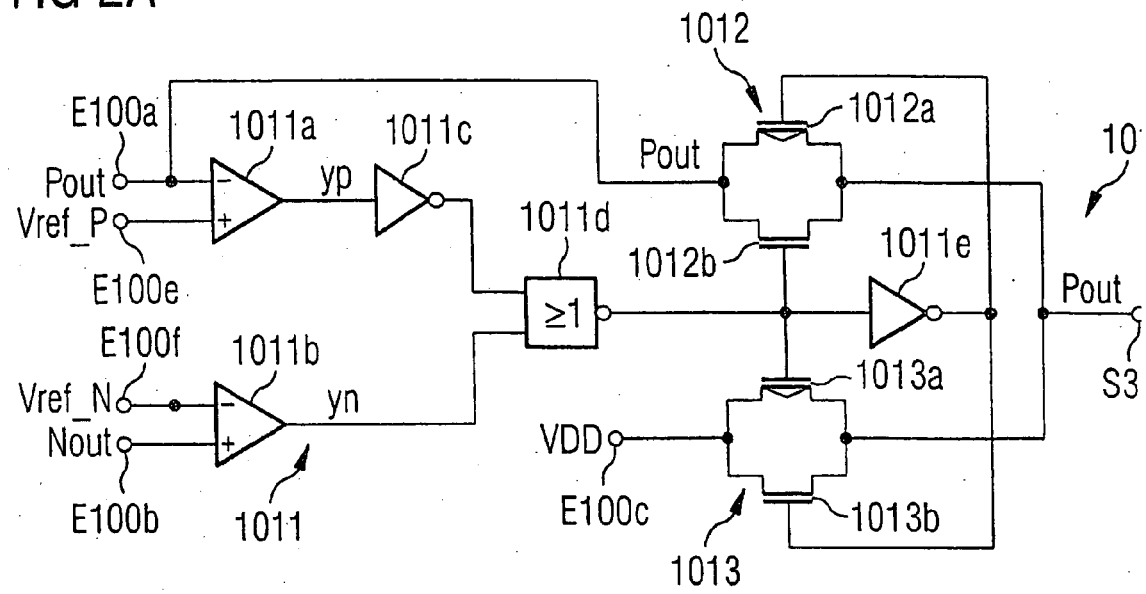
FIGS. 2A and 2B depict embodiments of a control unit for regulating a voltage generator according to the invention.

FIG. 2A shows an embodiment of the control circuit 101 of the control unit 100 of FIG. 1. The control circuit 101 includes a first comparator circuit 1011a and a second comparator circuit 1011b. The first comparator circuit 1011a compares the level of the control signal Pout present at the input terminal E100a with the level of the reference signal Vref_P present at the input terminal E100e. It generates a differential signal yp on the output side in a manner dependent on this comparison. The differential signal yp is fed via an inverter 1011c to a NOR gate 1011d.

The second comparator circuit 1011b is fed the control signal Nout at the input terminal E100b and the reference signal Vref_N at the input terminal E100f. The second comparator circuit 1011b generates a differential signal yn on the output side, which differential signal is likewise fed to the NOR gate 1011d. An output signal of the NOR gate 1011d is fed to an n-channel transfer transistor 1012b and, via an inverter 1011e, to a p-channel transistor 1012a of a CMOS transfer gate 1012. The CMOS transfer gate 1012 is connected to the input terminal E100a and, in the activated state, forwards the control signal Pout generated by the comparator circuit 10 to the control terminal S31 of the p-channel transistor 31. The p-channel transistor 31 is controlled into the on state in this case.

In the same way, the output signal of the NOR gate 1011b drives a p-channel transistor 1013a and, via the inverter 1011e, an n-channel transistor 1013b of a further CMOS transfer gate 1013. In the activated state of the transfer gate, the input terminal E100c of the control unit 100 for application of the supply voltage VDD is connected to the control terminal S31 of the p-channel transistor 31. The p-channel transistor 31 is turned off in this case.

Figure 2B:
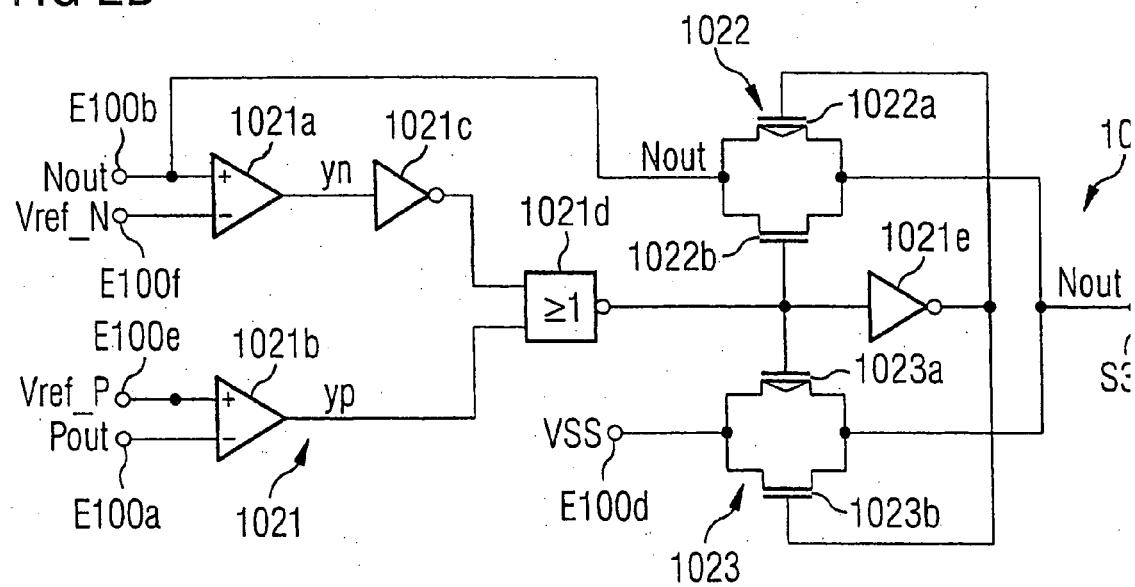

FIG. 2B shows an embodiment of the control circuit 102 of the control unit 100 of FIG. 1. The control circuit 102 includes a first comparator circuit 1021a, which is fed the control signal Nout via the input terminal E100b and the reference voltage Vref_N via the input terminal E100f. The first comparator circuit generates a differential signal yn on the output side, which differential signal is fed to an inverter 1021c and subsequently to an input side of a NOR gate 1021d. A second comparator circuit generates a differential signal yp on the output side, which differential signal is fed to a further input side of the NOR gate 1021d. An output signal generated by the NOR gate 1021d is fed to an n-channel transistor 1022b and, via an inverter 1021e, to a p-channel transistor 1022a of a CMOS transfer gate 1022. The output signal of the NOR gate 1021d is likewise fed to a control terminal of a p-channel transistor 1023a and, via the inverter 1021e, to a control terminal of an n-channel transistor 1023b of a further CMOS transfer gate 1023. In the activated state, the CMOS transfer gate 1022 connects the input terminal E100b for application of the control signal Nout, generated by the comparator circuit 20, to the control terminal S32 of the n-channel transistor 32. The n-channel transistor 32 is thereby controlled into the on state. In the activated state, the CMOS transfer gate 1023 connects the input terminal E100d for application of the reference voltage VSS to the control terminal S32 of the n-channel transistor 32. The n-channel transistor 32 is thereby turned off.

Table T1 illustrates the functioning of the control circuits 101, 102 of the control unit 100 in the case where the input terminals E100a are driven with the control signal Pout generated by the comparator circuit 10, and in the case where the input terminal E100b of the control unit 100 is driven with the control signal Nout generated by the comparator circuit 20. If the comparator circuit 10 generates the control signal Pout with a level Pout≦Vref_P and the comparator circuit 20 generates the control signal Nout with a level Nout≦Vref_N, then the control circuit 101 generates, at the control terminal S31, the control signal Pout with the high level VDD, corresponding for example to the supply voltage, and the control circuit 102 generates, at the control terminal S32, the control signal Nout with the low level VSS, corresponding for example to the reference voltage. This means that the transistors 31 and 32 are controlled in high-resistance fashion by the control unit 100 if the comparator circuit 10 attempts to control the transistor 31 in low-resistance fashion and at the same time the comparator circuit 20 attempts to control the transistor 32 in low-resistance fashion. A shunt current between the input terminal E30a for application of the supply voltage VDD and the input terminal E30b for application of the reference voltage is thereby prevented.

If the comparator circuit 10 generates the output signal Pout with a level approximately equal to but less than the supply voltage VDD and, at the same time, the comparator circuit 20 generates the control signal Nout with a level greater than the reference voltage Vref_N, then the control circuit 101, on the output side, drives the first controllable resistor 31 with the high level VDD of the control signal Pout and the control circuit 102 drives the second controllable resistor 32 with the level Nout fed to it from the comparator circuit 10. As a result, the transistor 31 is turned off, whereas the n-channel transistor 32 is controlled in low-resistance fashion.

If the comparator circuit 10 generates the control signal Pout with a level that is less than the reference voltage Vref_P, and the comparator circuit 20 generates the control signal Nout with a level approximately equal to but greater than the reference voltage VSS, then the control circuit 101, on the output side, drives the p-channel transistor 31 with the level of the control signal Pout that is fed to it from the comparator circuit 10, and the control circuit 102, on the output side, drives the n-channel transistor 32 with the control signal Nout, the level of which corresponds to the reference voltage VSS. As a result, the p-channel transistor 31 is controlled in low-resistance fashion, whereas the n-channel transistor 32 is turned off.

If the comparator circuit 10 generates the control signal Pout with a level that is approximately equal to the supply voltage VDD, and the comparator circuit 20 generates the control signal Nout with a level that is approximately equal to the reference voltage VSS, then the control circuit 101 generates, at the control terminal S31, the control signal Pout with the high level of the supply voltage VDD and the control circuit 102 generates, at the control terminal S32, the control signal Nout with the low level of the reference voltage VSS.

Consequently, the control circuit 101 and 102 ensures that there are never both transistors 31 and 32 controlled in low-resistance fashion.

TABLE 1

| E100a | E100b | yn | yp | S31 | S32 |
|---|---|---|---|---|---|
| Pout ≦ Vref_p | Nout ≦ Vref_N | VDD | VDD | VDD | VSS |
| Pout > Vref_P (Pout ≅ VDD) | Nout ≦ Vref_N | VDD | VSS | VDD | Nout |
| Pout ≦ Vref_P | Nout < Vref_N (Nout ≅ VSS) | VSS | VDD | Pout | VSS |

TABLE 1-continued

| E100a | E100b | yn | yp | S31 | S32 |
|---|---|---|---|---|---|
| Pout > Vref_P (Pout ≅ VDD) | Nout < Vref_N (Nout ≅ VSS) | VSS | VSS | VDD | VSS |

Figure 3:
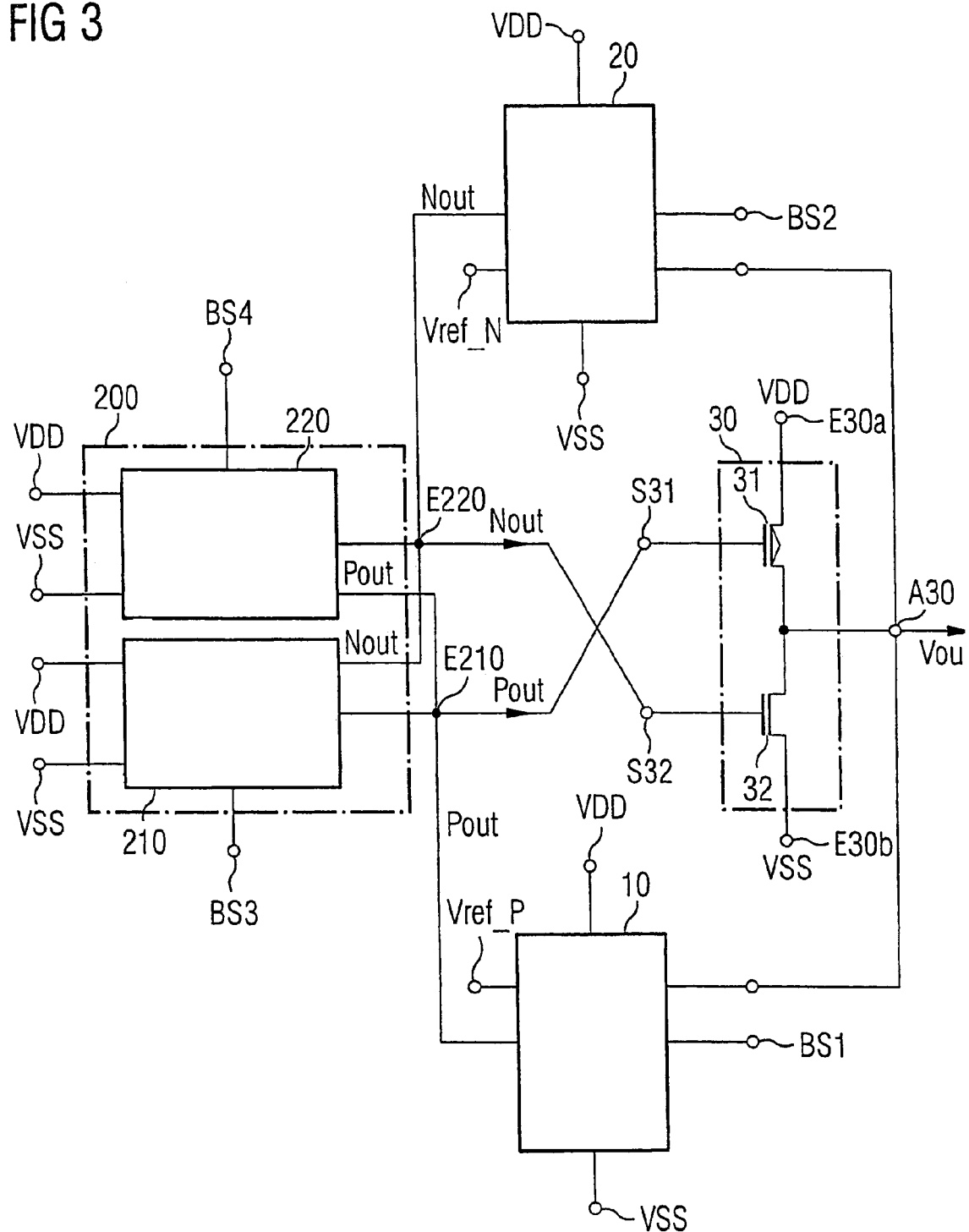
FIG. 3 depicts a second embodiment of an integrated circuit for regulating a voltage generator according to the invention.

FIG. 3 shows a second embodiment of an integrated circuit for regulating the push-pull generator 30. Besides the push-pull generator 30, the integrated circuit includes the comparator circuits 10 and 20 as described above with reference to FIG. 7. In addition, the integrated circuit of FIG. 3 includes a control unit 200 comprising the control circuits 210 and 220. The control circuits 210 and 220 in each case have terminals for application of the supply voltage VDD and for application of the reference voltage VSS. The operating point of the control circuit 210 is set by an operating point signal BS3 and the operating point of the control circuit 220 is set by an operating point signal BS4. The control signal Pout of the comparator circuit 10 is fed to the control circuit 210 via an input terminal E210. The control circuit 210 is likewise driven by the control signal Nout generated by the comparator circuit 20. The control circuit 220 is driven, at an input terminal E220, by the control signal Nout from the comparator circuit 20, and is additionally driven by the comparator circuit 10 with the control signal Pout. At the input terminal E210, which simultaneously also acts as an output terminal, the control circuit 210 generates the control signal Pout, which it feeds to the control terminal S31 of the p-channel transistor 31. At its input terminal E220, which likewise also acts as an output terminal, the control circuit 220 generates the output signal Nout, which it feeds to the control terminal S32 of the n-channel transistor 32.

Figure 4A:
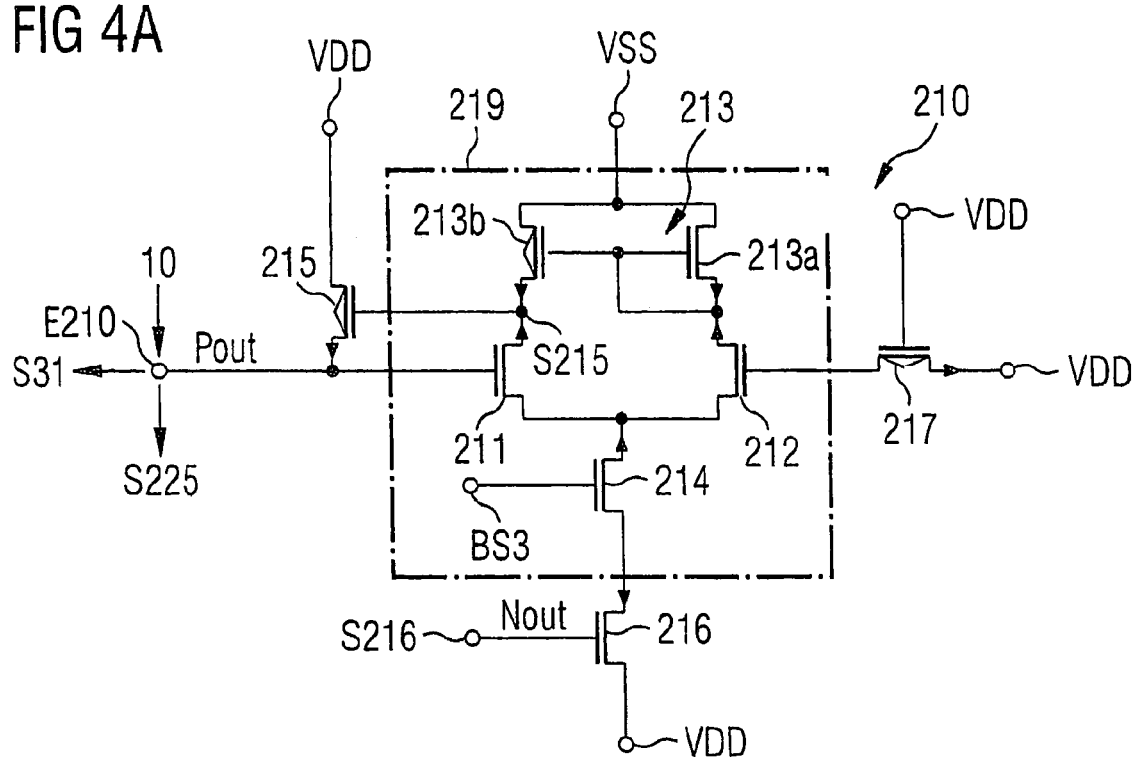
FIGS. 4A and 4B depict second embodiments of a control circuit for regulating a voltage generator according to the invention.
Figure 4B:
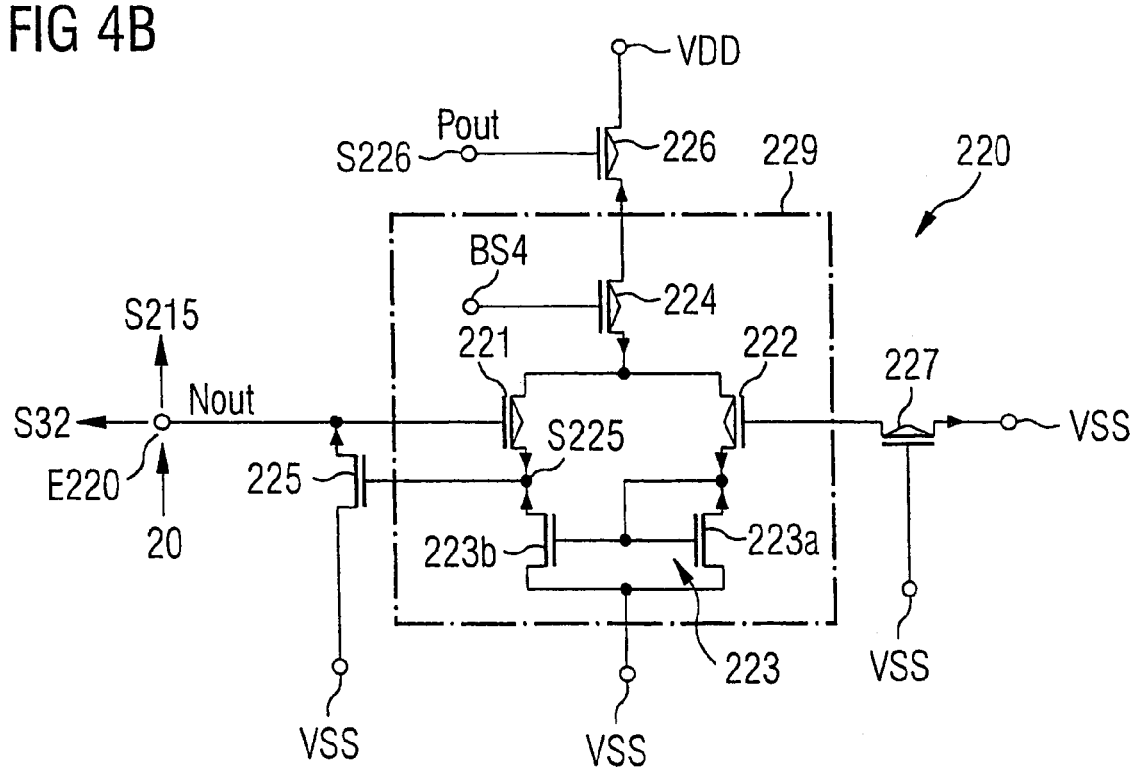

In order to describe the method of operation of the control circuits 210 and 220, the internal construction of the control circuit 210 and of the control circuit 220 is shown in FIGS. 4A and 4B. The control circuit 210 illustrated in FIG. 4A includes a differential amplifier 219, which, in terms of the arrangement of its switching elements, is constructed identically to the differential amplifier 10 of FIG. 7. The two n-channel input transistors 211 and 212 are connected via an active load 213, comprising the p-channel transistors 213a and 213b connected as a current mirror, to a terminal for application of the reference voltage VSS. In order to set the operating point of the differential amplifier 219, the common branch of the input transistors 211 and 212 contains a controlled current source configured as an n-channel transistor 214, which is driven by the operating point signal BS3.

The control signal Pout is fed to a control terminal E210 of the input transistor 211 from the comparator circuit 10. The supply voltage VDD is fed to a control terminal of the input transistor 212 via a n-channel transistor 217, which can be activated by the application of the level of the supply voltage VDD at its control terminal. By virtue of a threshold voltage drop across the controlled path of the n-channel transistor 217, the supply voltage VDD reduced by the threshold voltage of the transistor 217 is present at the control terminal of the input transistor 212.

FIG. 4B shows an embodiment of the control circuit 220. The control circuit 220 has a differential amplifier 229 connected between the supply voltage VDD and the reference voltage VSS. In terms of its internal construction, the differential amplifier 229 is constructed identically to the differential amplifier 20 of FIG. 7. It contains a p-channel input transistor 221 and a p-channel input transistor 222. The input transistors 221 and 222 are connected to the reference voltage VSS via an active load 223 comprising the n-channel transistors 223a and 223b connected as a current mirror. In order to set the operating point of the differential amplifier, a controlled current source configured as a p-channel transistor 224 is connected into a common branch of the input transistors. The operating point of the differential amplifier circuit can be set by driving the p-channel transistor 224 with the operating point signal BS4.

The differential amplifier 229 is connected to the supply voltage VDD via a controllable switch 226 designed as a p-channel transistor. The output terminal of the differential amplifier 229 is connected to the control terminal S225 of an n-channel switching transistor 225. By means of the n-channel switching transistor 225, the input terminal E220 of the control circuit 220 can be pulled to the level of the reference voltage VSS. The control terminal of the input transistor 221 is driven with the control signal Nout by the comparator circuit 20. The control terminal of the input transistor 222 is connected to the reference voltage VSS via a p-channel transistor 227, which is activated by application of the reference voltage to its control terminal. In the activated state of the transistor 227, the input transistor 222 is driven with the level of the reference voltage VSS shifted by the threshold voltage of the transistor 227.

The functioning of the control circuits 210 and 220 is described as follows. In the case of the control circuit 210, the level of the control signal Pout that is supplied by the comparator circuit 10 is compared with the level of the supply voltage VDD reduced by the threshold voltage of the transistor 217. If the level of the control signal Pout rises up to the level of the supply voltage reduced by the level of the threshold voltage, then the differential amplifier 219 generates a low level at its output terminal S215, which low level controls a p-channel switching transistor 215 into the on state. The control signal Pout generated by the comparator circuit 10, which control signal in this case is already close to the level of the supply voltage, is thus pulled to the level of the supply potential VDD via the turned-on path of the switching transistor 215. The control terminal S31 of the p-channel transistor 31 is thus driven by the high voltage level of the supply voltage VDD, which turns the transistor 31 off.

The high level VDD of the control signal Pout is simultaneously fed via the input terminal E210 to the control terminal S226 of the switching transistor 226 of the control circuit 220. The p-channel transistor 226 is turned off by the high level, so that the differential amplifier 229 is deactivated.

The control terminal S32 of the n-channel transistor 32 is thus driven only by the control signal Nout generated by the comparator circuit 20. In this operating case, the n-channel transistor 32 regulates the voltage generator 30, whereas the p-channel transistor 31 is turned off.

The control circuit 220 compares the level of the control signal Nout fed to it from the comparator circuit 20 with a level of the reference voltage VSS altered by the threshold voltage drop of the transistor 227. If the comparator circuit 20 generates the control signal Nout with a level that approximately corresponds to the voltage level of the reference voltage VSS reduced by the threshold voltage drop, the differential amplifier 229 generates a high voltage potential on the output side and feeds it to the control terminal S225 of the n-channel switching transistor 225. The switching transistor 225 is thereby activated, where the input terminal E220 is pulled to the low level of the reference voltage VSS.

The control terminal S32 of the n-channel transistor 32 is thus driven by the low level of the reference voltage VSS, as a result of which it is turned off. At the same time, the low level of the reference voltage is fed to the control terminal S216 of the control circuit 210. The switching transistor 216 is thus turned off, as a result of which the differential amplifier 219 is isolated from the supply voltage VDD and is thus deactivated. In this operating case, the control terminal S31 of the p-channel transistor 31 is driven by the control signal Pout generated by the comparator circuit 10. In this operating case, the p-channel transistor 31 is controlled in low-resistance fashion, whereas the n-channel transistor 32 is turned off.

Figure 5:
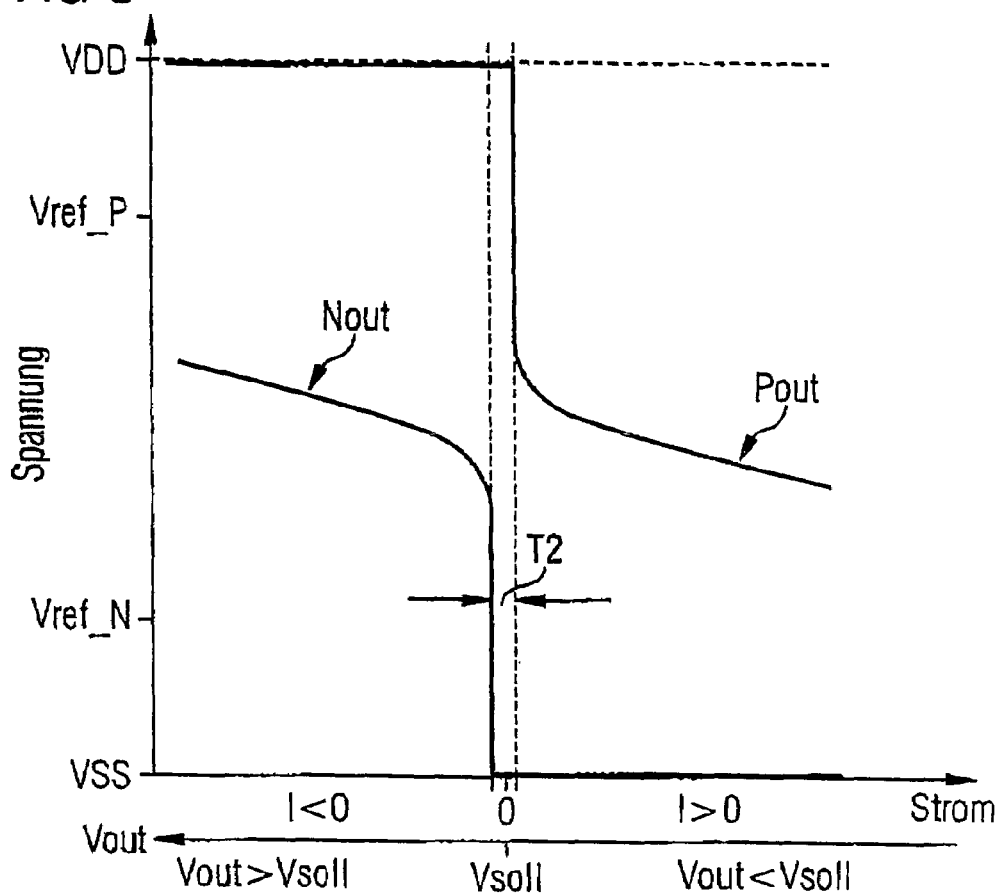
FIG. 5 depicts a current/voltage diagram with control signals for regulating a voltage generator according to the invention.

FIG. 5 illustrates, in a similar manner to FIG. 8, the profile of the control signals Nout and Pout of the integrated circuit according to the invention for generating the control signals for the case of overvoltage if the voltage of the internal network Vout is greater than the desired voltage Vdesired, and for the case of undervoltage if the output voltage of the internal network Vout is less than the desired voltage Vdesired.

In the case of overvoltage, the p-channel transistor 31 is driven by the high level of the supply voltage VDD, which is generated by the control circuit 210. At the same time, the control circuit 210 deactivates the control circuit 220. The n-channel transistor 32 is thereby driven by a regulating voltage Nout which is supplied exclusively by the comparator circuit 220. Consequently, the n-channel transistor 32 is controlled in low-resistance fashion since the level of the control signal Nout lies above a level of the threshold voltage Vref_N of the transistor 32. Within the dead zone T2, in a small voltage range around the desired voltage Vdesired, both transistors 31 and 32 are momentarily turned off by the control circuits 210 and 220. As a result, the internal voltage Vout falls below the desired voltage Vdesired. In this case, the control circuit 220 pulls the level of the control signal Nout to the level of the reference voltage VSS. The n-channel transistor 32 is thereby turned off.

At the same time, the control circuit 220 likewise drives the control circuit 210 with the level of the reference voltage VSS, as a result of which the switching transistor 216 is turned off and the control circuit 210 is thus deactivated. The p-channel transistor 31 is thus driven by a regulating voltage Pout generated exclusively by the comparator circuit 10. The p-channel transistor 31 is controlled in low-resistance fashion by means of the low level of the control signal Pout generated by the comparator circuit 10 in comparison with the supply voltage VDD. The internal voltage Vout thus rises again.

Figure 6:
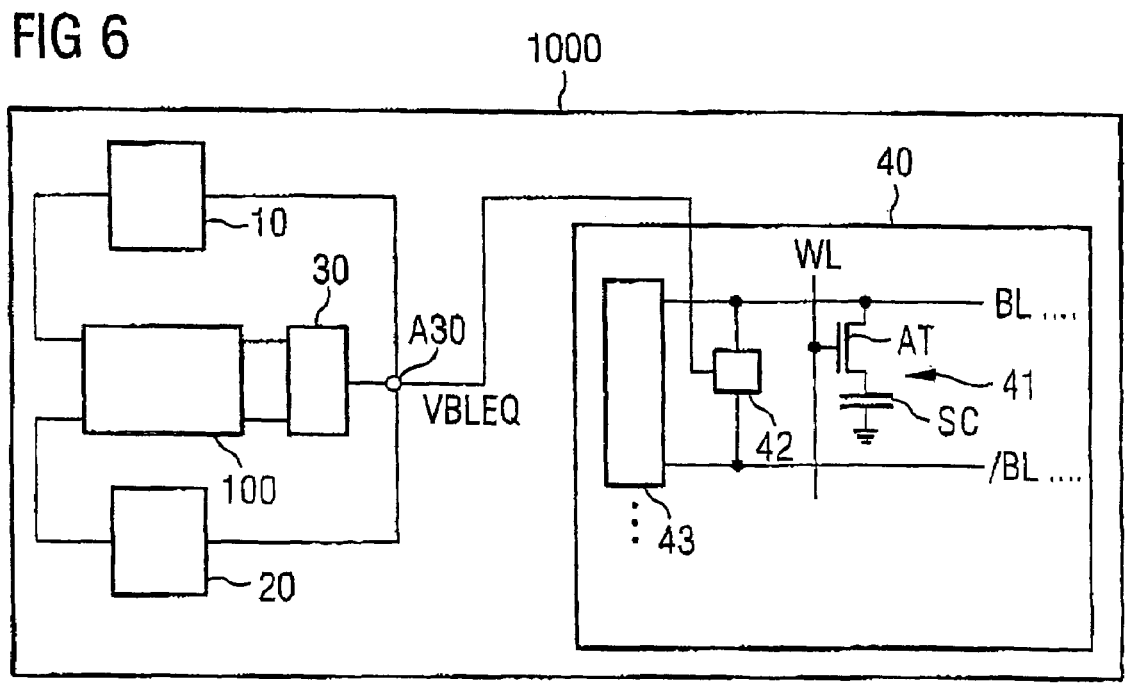
FIG. 6 depicts an integrated semiconductor memory with an integrated circuit for regulating a voltage generator according to the invention.

FIG. 6 shows an exemplary application of the integrated circuit for regulating a voltage generator. An integrated semiconductor memory 1000 contains the embodiment of the integrated circuit that is described above and illustrated in FIGS. 1 and 2, where the integrated circuit regulates the push-pull generator 30 and comprises the comparator circuit 10, the comparator circuit 20 and the control unit 100. The integrated semiconductor memory 1000 furthermore has a memory cell array 40. In the memory cell array 40, memory cells 41, designed for example as DRAM memory cells, are arranged along bit lines BL and word lines WL.

FIG. 6 illustrates, in an exemplary manner, a DRAM memory cell comprising the selection transistor AT and the storage capacitor SC. The bit line BL connected to the memory cell 41 is connected to a sense amplifier 43. A complementary bit line/BL is likewise connected to the sense amplifier 43. In the event of reading from the memory cell SZ, the sense amplifier 43 compares a signal on the bit line BL with a reference signal on the complementary bit line/BL and generates on the output side a data signal representing the information stored in the memory cell 41.

In order to assess the voltage level on the bit line BL and the complementary bit line/BL, the bit lines BL and the complementary bit line/BL with respect thereto have to be charged to a common equalization potential VBLEQ prior to a read operation. In the exemplary embodiment of FIG. 6, the equalization potential VBLEQ is generated by the integrated circuit according to the invention comprising the two comparator circuits 10 and 20, the control unit 100 and the push-pull generator 30, at the output terminal A30.

The integrated circuit according to the invention prevents a high current loss from being generated in the event of voltage fluctuations within the internal network of the integrated semiconductor memory, for example in the event of voltage fluctuations along the bit lines of the memory cell array 40, by the push-pull generator 30. The integrated circuit according to the invention ensures that at most one of the two transistors is controlled in low-resistance fashion.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference symbols | |
| --- | --- |
| 10 | Comparator circuit |
| 11, . . . , 14 | Transistors of the first comparator circuit |
| 20 | Second comparator circuit |
| 21, . . . , 24 | Transistors of the second comparator circuit |
| 30 | Voltage generator |
| 31 | First controllable resistor |
| 32 | Second controllable resistor |
| 100 | Control unit |
| 101 | First control circuit |
| 102 | Second control circuit |
| E | Input terminal |
| A | Output terminal |
| Pout | First control signal |
| Nout | Second control signal |
| VDD | First voltage potential |
| VSS | Second voltage potential |
| Vref_P | First reference voltage |
| Vref_N | Second reference voltage |
| BS | Operating point signal |
| Vout | Output voltage |
| S | Control terminal |
| 1011 | Control logic |
| 1012, 1013 | Controllable switch |
| 1021 | Control logic |
| 1022, 1023 | Controllable switch |
| 200 | Control unit |
| 210 | First control circuit |
| 211, . . . , 214 | Transistors of the first control circuit |
| 216 | First controllable switch of the first control circuit |
| 215 | Second controllable switch of the first control circuit |
| 217 | Controllable resistor of the first control circuit |
| 220 | Second control circuit |
| 221, . . . , 224 | Transistors of the second control circuit |
| 225 | First controllable switch of the first control circuit |
| 226 | Second controllable switch of the second control circuit |
| 227 | Controllable resistor of the second control circuit |

What is claimed:

1. An integrated circuit for regulating a voltage generator, the integrated circuit comprising:

a first input terminal to apply a first voltage potential;

a second input terminal to apply a second voltage potential;

an output terminal to generate an output voltage;

a voltage generator including a first controllable resistor and a first control terminal to set a resistance value for the first controllable resistor, and a second controllable resistor and a second control terminal to set a resistance value for the second controllable resistor, wherein the first input terminal is connected to the output terminal via the first controllable resistor and the second input terminal is connected to the output terminal via the second controllable resistor;

a first comparator circuit to generate a first control signal at a level dependent on a comparison of the output voltage with a first reference voltage that is fed to the first control terminal so as to set the resistance value of the first controllable resistor;

a second comparator circuit to generate a second control signal at a level dependent on a comparison of the output voltage with a second reference voltage that is fed to the second control terminal so as to set the resistance value of the second controllable resistor; and a control unit to generate the first control signal at a first level and to generate the second control signal at a second level;

wherein the control unit is driven with the first control signal generated by the first comparator circuit and with the second control signal generated by the second comparator circuit;

wherein the first control signal at the first level that is generated by the control unit is fed to the control terminal of the first controllable resistor so as to set the resistance value of the first controllable resistor, and the second control signal at the second level that is generated by the control circuit is fed to the control terminal of the second controllable resistor so as to set the resistance value of the second controllable resistor;

wherein the control unit is configured to drive the control terminal of the first controllable resistor with the first control signal at the level that is generated by the first comparator circuit when the control unit is driven by the first comparator circuit with the first control signal at a level that controls the first controllable resistor to a low-resistance state, and when the control unit is driven by the second comparator circuit with the second control signal at a level that controls the second controllable resistor to a high-resistance state, otherwise the control unit drives the first controllable resistor with the first control signal at the first level such that the first controllable resistor is controlled to a high-resistance state; and wherein the control unit is configured to drive the control terminal of the second controllable resistor (32) with the second control signal at the level that is generated by the second comparator circuit when the control unit is driven by the first comparator circuit with the first control signal at a level that controls the first controllable resistor to a high-resistance state, and when the control unit is driven by the second comparator circuit with the second control signal at a level that controls the second controllable resistor to a low-resistance state, otherwise the control unit drives the second controllable resistor with the second control signal at the second level such that the second controllable resistor is controlled to a high-resistance state.

2. The integrated circuit of claim 1, wherein the first comparator circuit is configured as a first differential amplifier and the second comparator circuit is configured as a second differential amplifier.

3. The integrated circuit of claim 2, wherein:

the first differential amplifier includes a first input terminal to apply the first reference voltage, a second input terminal to apply the output voltage, a first input transistor that is controlled by the first reference voltage, and a second input transistor that is controlled by the output voltage;

the first and second input transistors of the first differential amplifier are connected via a controllable current source to a terminal that applies the first voltage potential; and the first and second input transistors are connected via an active load to a terminal that applies the second voltage potential.

4. The integrated circuit of claim 3, wherein:

the first input transistor and the second input transistor of the first differential amplifier are configured as n-channel transistors;

the controllable current source of the first differential amplifier is configured as an n-channel transistor; and the active load of the first differential amplifier is configured as a current mirror including a first p-channel transistor and a second p-channel transistor.

5. The integrated circuit of claim 2, wherein:

the second differential amplifier includes a first input terminal to apply the second reference voltage and a second input terminal to apply the output voltage, a first input transistor that is controlled by the second reference voltage, and a second input transistor that is controlled by the output voltage;

the first and second input transistors of the second differential amplifier are connected via a controllable current source to a terminal that applies the first voltage potential; and the first and second input transistors of the second differential amplifier are connected via an active load to a terminal that applies the second voltage potential.

6. The integrated circuit of claim 5, wherein:

the first input transistor and the second input transistor of the second differential amplifier are configured as p-channel transistors;

the controllable current source of the second differential amplifier is configured as a p-channel transistor; and the active load of the second differential amplifier is configured as a current mirror including a first n-channel transistor and a second n-channel transistor.

7. The integrated circuit of claim 1, wherein:

the first controllable resistor is configured as a first transistor including a threshold voltage that is controlled to a low-resistance state when the first control terminal is driven by a control signal having a level that lies within a first voltage range;

the second controllable resistor is configured as a second transistor including a threshold voltage that is controlled to a low-resistance state when the second control terminal is driven by a control signal having a level that lies within a second voltage range;

the control unit is configured to generate the first control signal at the first level when the first comparator circuit drives the control unit with the first control signal at a level that lies within the first voltage range, and the second comparator circuit drives the control unit the second control signal at a level that lies within the second voltage range; and the control unit is configured to generate the second control signal at the second level when the first comparator circuit drives the control unit with the first control signal at a level that lies within the first voltage range, and the second comparator circuit drives the control unit with the second control signal at a level that lies within the second voltage range.

8. The integrated circuit of claim 7, wherein:

the control unit comprises a first control circuit and a second control circuit;

the first control circuit is fed the first control signal from the first comparator circuit and the second control circuit is fed the second control signal from the second comparator circuit;

the first voltage potential is fed to the first control circuit on an input side of the first control circuit, and the second voltage potential is fed to the second control circuit on an input side of the second control circuit;

the first control circuit is configured to drive the control terminal of the first controllable resistor of the voltage generator circuit with the first voltage potential when the first control circuit is driven by the first control signal at a level that lies at a predetermined distance from the first voltage potential;

the first control circuit is configured to drive the control terminal of the first controllable resistor of the voltage generator circuit with the first voltage potential when the first control circuit is driven by the first control signal at the level that controls the first controllable resistor of the voltage generator circuit to a low-resistance state, and the first control circuit is driven by the second control signal at the level that controls the second controllable resistor of the voltage generator circuit to a low-resistance state;

the second control circuit is configured to drive the control terminal of the second controllable resistor of the voltage generator circuit with the second voltage potential when the second control circuit is driven by the second control signal at the level that lies at a predetermined distance from the second voltage potential; and the second control circuit is configured to drive the control terminal of the second controllable resistor of the voltage generator circuit with the second voltage potential when the second control circuit is driven by the first control signal at the level that controls the first controllable resistor of the voltage generator circuit to a low-resistance state, and the second control circuit is driven by the level of the second control signal that controls the second controllable resistor of the voltage generator circuit to a low-resistance state.

9. The integrated circuit of claim 8, wherein:

the first control circuit comprises a control logic and the second control circuit comprises a control logic;

the control logic of the first control circuit is driven on an input side of the first control circuit with the first control signal by the first comparator circuit, and the control logic of the second control circuit is driven on an input side of the second control circuit with the second control signal by the second comparator circuit; and the first reference voltage is fed to the control logic of the first control circuit on the input side and the second reference voltage is fed to the control logic of the second control circuit on the input side.

10. The integrated circuit of claim 9, wherein:

the first control circuit includes a first controllable switch and a second controllable switch;

the first control signal generated by the first comparator circuit is fed via the first controllable switch of the first control circuit to the control terminal of the first controllable resistor of the voltage generator;

the first voltage potential is fed via the second controllable switch of the first control circuit to the control terminal of the first controllable resistor of the voltage generator;

the first and second controllable switches of the first control circuit are controlled by the control logic of the first control circuit; and the control logic of the first control circuit is configured to control the first controllable switch of the first control circuit into an on state when the first control signal generated by the first comparator circuit lies at a level below the first reference voltage and the second control signal generated by the second comparator circuit lies at a level below the second reference voltage, otherwise the control logic of the first control circuit controls the second controllable switch of the first control circuit into an on state.

11. The integrated circuit of claim 9, wherein:

the second control circuit includes a first controllable switch and a second controllable switch;

the second control signal generated by the second comparator circuit is fed via the first controllable switch to the control terminal of the second controllable resistor of the voltage generator;

the second voltage potential is fed via the second controllable switch of the second control circuit to the control terminal of the second controllable resistor of the voltage generator;

the first and second controllable switches of the second control circuit are controlled by the control logic of the second control circuit; and the control logic of the second control circuit is configured to control the first controllable switch of the second control circuit into an on state when the first control signal generated by the first comparator circuit lies at a level above the first reference voltage and the second control signal generated by the second comparator circuit lies at a level above the second reference voltage, otherwise the control logic of the second control circuit controls the second controllable switch of the second control circuit into an on state.

12. The integrated circuit of claim 1, wherein:

the control unit comprises a first control circuit and a second control circuit;

the first control circuit is fed the first control signal from the first comparator circuit and the second control circuit is fed the second control signal from the second comparator circuit;

the first control circuit is fed the first voltage potential on an input side of the first control circuit, and the second control circuit is fed the second voltage potential on an input side of the second control circuit;

the first control circuit is configured to drive the control terminal of the first controllable resistor of the voltage generator circuit with the first voltage potential when the first control circuit is driven by the first control signal at a level that lies at a predetermined distance from the first voltage potential; and the second control circuit is configured to drive the control terminal of the second controllable resistor of the voltage generator circuit with the second voltage potential when the second control circuit is driven by the second control signal at a level that lies at a predetermined distance from the second voltage potential.

13. The integrated circuit of claim 12, wherein:
the first control circuit comprises a controllable switch through which the first voltage potential is fed to the control terminal of the first controllable resistor of the voltage generator circuit;
the first control circuit further comprises a differential amplifier including an output side that is connected to a control terminal of the first controllable switch of the first control circuit; and
the differential amplifier is configured to control the first controllable switch into an on state when the differential amplifier is driven by the first comparator circuit with the first control signal at the level that lies at the predetermined distance from the first voltage potential.

14. The integrated circuit of claim 12, wherein:
the second control circuit comprises a controllable switch through which the second voltage potential is fed to the control terminal of the second controllable resistor of the voltage generator circuit;
the second control circuit further comprises a differential amplifier including an output side that is connected to a control terminal of the first controllable switch of the second control circuit; and
the differential amplifier is configured to control the first controllable switch into an on state when the differential amplifier is driven by the second comparator circuit with the second control signal at the level that lies at the predetermined distance from the second voltage potential.

15. The integrated circuit of claim 13, wherein:
the first control circuit comprises a second controllable switch through which the differential amplifier of the first control circuit is connected to the first voltage potential;
the second controllable switch of the first control circuit is controlled by the first control signal; and
the second controllable switch of the first control circuit is configured to be turned to an off position when the second control circuit generates the second control signal with the second level on the output side, otherwise the second controllable switch is configured to be turned to an on state.

16. The integrated circuit of claim 13, wherein:
the second control circuit comprises a second controllable switch through which the differential amplifier of the second control circuit is connected to the first voltage potential;
the second controllable switch of the second control circuit is controlled by the first control signal; and
the second controllable switch of the second control circuit is configured to be turned to an off position when the first control circuit generates the first control signal with the first level on the output side, otherwise the second controllable switch is configured to be turned to an on state.

17. The integrated circuit of claim 1, wherein the first controllable resistor of the voltage generator circuit is configured as a p-channel transistor, and the second controllable resistor of the voltage generator circuit is configured as an n-channel transistor.

18. The integrated circuit of claim 1, wherein the first voltage potential has a high level and the second voltage potential has a low level.

19. A method for operating an integrated circuit, comprising:
providing a first controllable resistor with a first conductivity type, the first controllable resistor being controlled by a first control signal and connecting a terminal that applies a supply voltage to an output terminal that generates an output voltage;
providing a second controllable resistor with a second conductivity type, the second controllable resistor being controlled by a second control signal and connecting a terminal that applies a reference voltage to the output terminal that generates the output voltage;
providing a control unit to drive the first controllable resistor with the first control signal and to drive the second controllable resistor with the second control signal;
providing a first comparator circuit to compare an actual value of the output voltage with a first reference voltage;
providing a second comparator circuit to compare the actual value of the output voltage with a second reference voltage;
generating an output signal by the first comparator circuit that is dependent on the comparison of the actual value of the output voltage with the first reference voltage;
generating an output signal by the second comparator circuit that is dependent on the comparison of the actual value of the output voltage with the second reference voltage;
driving the control unit with the output signal of the first comparator circuit and with the output signal of the second comparator circuit;
driving the control terminal of the first controllable resistor utilizing the control unit and with the output signal generated by the first comparator circuit when the control unit is driven with a level of the output signal of the first comparator circuit that controls the first controllable resistor to a low-resistance state and when the control unit is driven with a level of the output signal of the second comparator circuit that controls the second controllable resistor to a high-resistance state, otherwise driving the control terminal of the first controllable resistor with a first level of the first control signal such that the first controllable resistor is controlled to a high-resistance state; and
driving the control terminal of the second controllable resistor utilizing the control unit with the output signal generated by the second comparator circuit when the control unit is driven with a level of the output signal of the first comparator circuit that controls the first controllable resistor to a high-resistance state and when the control unit is driven with a level of the output signal of the second comparator circuit that controls the second controllable resistor to a low-resistance state, otherwise driving the control terminal of the second controllable resistor with a second level of the second control signal such that the second controllable resistor is controlled to a high-resistance state.

* * * * *